United States Patent
Simsek-Ege et al.

(10) Patent No.: US 12,113,015 B2
(45) Date of Patent: Oct. 8, 2024

(54) VERTICAL TRANSISTOR FUSE LATCHES

(71) Applicant: Micron Technology, Inc., Boise, ID (US)

(72) Inventors: Fatma Arzum Simsek-Ege, Boise, ID (US); Yuan He, Boise, ID (US)

(73) Assignee: Micron Technology, Inc., Boise, ID (US)

(*) Notice: Subject to any disclaimer, the term of this patent is extended or adjusted under 35 U.S.C. 154(b) by 309 days.

(21) Appl. No.: 17/396,341

(22) Filed: Aug. 6, 2021

(65) Prior Publication Data
US 2023/0043108 A1 Feb. 9, 2023

(51) Int. Cl.
*H01L 23/525* (2006.01)
*G11C 29/00* (2006.01)
*H10B 12/00* (2023.01)
*G11C 11/4096* (2006.01)

(52) U.S. Cl.
CPC ......... *H01L 23/5256* (2013.01); *H10B 12/50* (2023.02); *G11C 11/4096* (2013.01)

(58) Field of Classification Search
CPC ........... H01L 23/5256; H01L 29/66666; H01L 29/7827; H10B 12/50; G11C 11/4096; G11C 17/16; G11C 17/165; G11C 29/789; G11C 29/787; G11C 29/027
See application file for complete search history.

(56) References Cited

U.S. PATENT DOCUMENTS

| | | | |
|---|---|---|---|
| 5,206,583 A * | 4/1993 | Dawson | G11C 29/027 438/467 |
| 2003/0112029 A1* | 6/2003 | Zimlich | G11C 29/4401 326/10 |
| 2003/0117865 A1* | 6/2003 | Hofmann | H10B 12/482 257/E29.112 |
| 2018/0082750 A1* | 3/2018 | Ikeda | G11C 11/005 |

* cited by examiner

*Primary Examiner* — Sophia T Nguyen
*Assistant Examiner* — John Lin
(74) *Attorney, Agent, or Firm* — Holland & Hart LLP

(57) ABSTRACT

Methods, systems, and devices for vertical transistor fuse latches are described. An apparatus may include a substrate and a memory array that is coupled with the substrate. The apparatus may also include a latch that is configured to store information from a fuse for the memory array. The latch may be at least partially within an additional substrate separate from and above the substrate. The latch may include a quantity of p-type vertical transistors and a quantity of n-type vertical transistors each at least partially disposed within the additional substrate above the substrate.

19 Claims, 5 Drawing Sheets

VERTICAL TRANSISTOR FUSE LATCHES

FIELD OF TECHNOLOGY

The following relates generally to one or more systems for memory and more specifically to vertical transistor fuse latches.

BACKGROUND

Memory devices are widely used to store information in various electronic devices such as computers, user devices, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

In some memory devices, a memory array and supporting circuitry for operating the memory array may be disposed on a first substrate, which may be referred to as a base substrate, formed at least partially within the base substrate, or both. For example, latches that store fuse information for the memory array may be disposed on the base substrate, which may limit dimensioning of the base substrate, reduce the area of the base substrate available for other components, or both, among other disadvantages. According to the techniques described herein, latches that store fuse information for a memory array may include (e.g., be composed of) vertical transistors (e.g., pillar transistors, thin film transistors) that are above the base substrate. For example, one or more of the vertical transistors may be disposed at least partially within an additional substrate (or other material) that is separate from and above the base substrate. Disposition of the latches above the base substrate (e.g., at least partially within the additional substrate) may free up space on the base substrate for other components, permit a smaller-dimensioned base substrate, or both, among other advantages.

Features of the disclosure are initially described in the context of memory devices as described with reference to FIGS. 1 and 2. Features of the disclosure are described in the context latches as described with reference to FIGS. 3-4. These and other features of the disclosure are further illustrated by and described with reference to a device that supports vertical transistor fuse latches as described with reference to FIG. 5.

Figure 1:
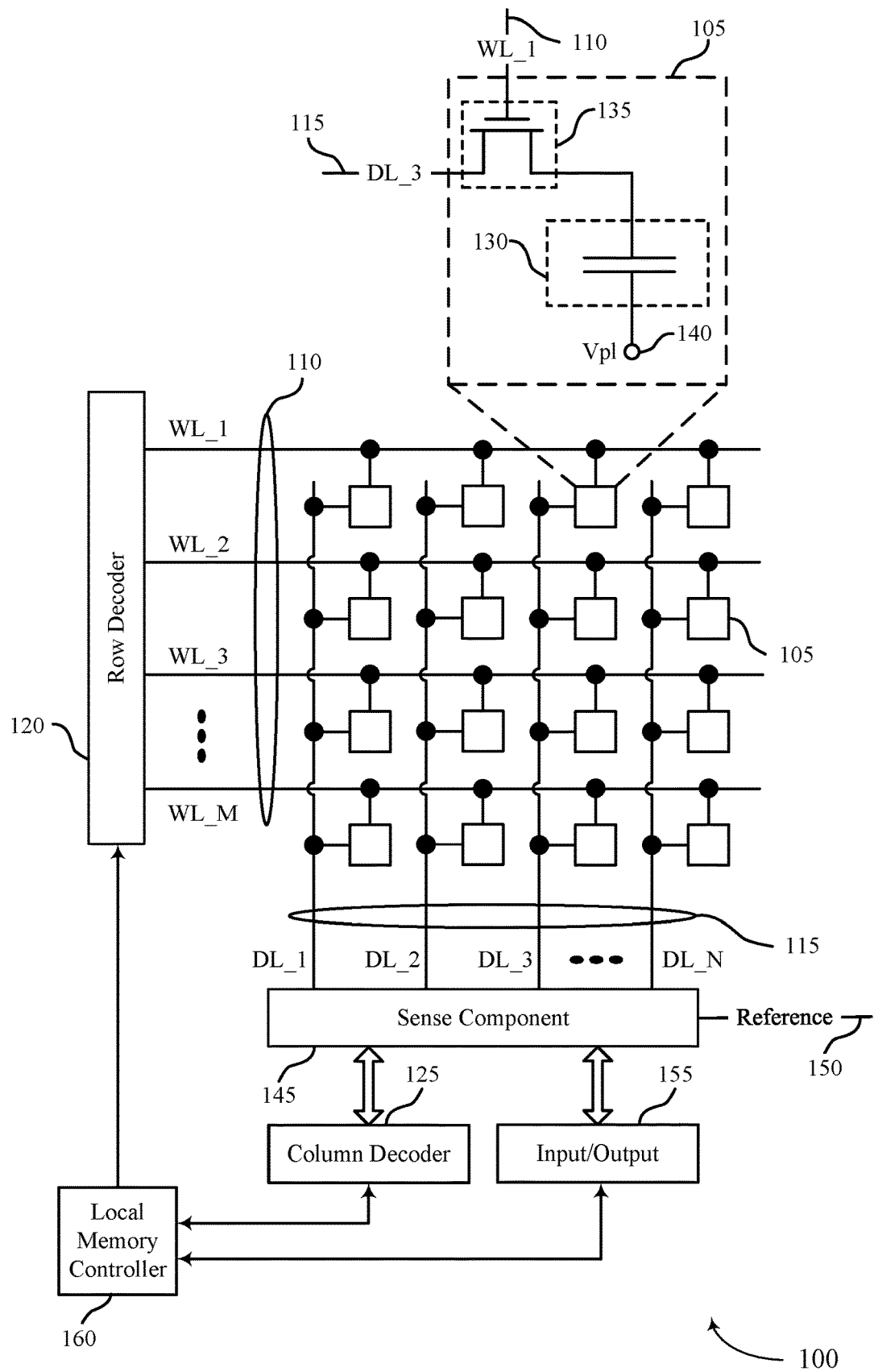
FIG. 1 illustrates an example of a memory device that supports vertical transistor fuse latches in accordance with examples as disclosed herein.

FIG. 1 illustrates an example of a memory device 100 that supports vertical transistor fuse latches in accordance with examples as disclosed herein. In some examples, the memory device 100 may be referred to as a memory chip, a memory device, or an electronic memory apparatus. The memory device 100 may include one or more memory cells 105 that may each be programmable to store different logic states (e.g., programmed to one of a set of two or more possible states). For example, a memory cell 105 may be operable to store one bit of information at a time (e.g., a logic 0 or a logic 1). In some examples, a memory cell 105 (e.g., a multi-level memory cell) may be operable to store more than one bit of information at a time (e.g., a logic 00, logic 01, logic 10, a logic 11). In some examples, the memory cells 105 may be arranged in an array which may be referred to as a memory array.

A memory cell 105 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 105 may include a logic storage component, such as capacitor 130, and a switching component 135. The capacitor 130 may be an example of a dielectric capacitor or a ferroelectric capacitor. A node of the capacitor 130 may be coupled with a voltage source 140, which may be the cell plate reference voltage, such as Vp1, or may be ground, such as Vss.

The memory device 100 may include one or more access lines (e.g., one or more word lines 110 and one or more digit lines 115) arranged in a pattern, such as a grid-like pattern. An access line may be a conductive line coupled with a memory cell 105 and may be used to perform access operations on the memory cell 105. In some examples, word lines 110 may be referred to as row lines. In some examples, digit lines 115 may be referred to as column lines or bit lines. References to access lines, row lines, column lines, word lines, digit lines, or bit lines, or their analogues, are interchangeable without loss of understanding or operation. Memory cells 105 may be positioned at intersections of the word lines 110 and the digit lines 115.

Operations such as reading and writing may be performed on the memory cells 105 by activating or selecting access lines such as one or more of a word line 110 or a digit line 115. By biasing a word line 110 and a digit line 115 (e.g., applying a voltage to the word line 110 or the digit line 115), a single memory cell 105 may be accessed at their intersection. The intersection of a word line 110 and a digit line 115 in either a two-dimensional or three-dimensional configuration may be referred to as an address of a memory cell 105.

Accessing the memory cells 105 may be controlled through a row decoder 120 or a column decoder 125. For example, a row decoder 120 may receive a row address from the local memory controller 160 and activate a word line 110 based on the received row address. A column decoder 125 may receive a column address from the local memory controller 160 and may activate a digit line 115 based on the received column address.

Selecting or deselecting the memory cell 105 may be accomplished by activating or deactivating the switching component 135 using a word line 110. The capacitor 130 may be coupled with the digit line 115 using the switching component 135. For example, the capacitor 130 may be isolated from digit line 115 when the switching component 135 is deactivated, and the capacitor 130 may be coupled with digit line 115 when the switching component 135 is activated.

A word line 110 may be a conductive line in electronic communication with a memory cell 105 that is used to perform access operations on the memory cell 105. In some architectures, the word line 110 may be coupled with a gate of a switching component 135 of a memory cell 105 and may be operable to control the switching component 135 of the memory cell. In some architectures, the word line 110 may be coupled with a node of the capacitor of the memory cell 105 and the memory cell 105 may not include a switching component.

A digit line 115 may be a conductive line that connects the memory cell 105 with a sense component 145. In some architectures, the memory cell 105 may be selectively coupled with the digit line 115 during portions of an access operation. For example, the word line 110 and the switching component 135 of the memory cell 105 may be operable to couple and/or isolate the capacitor 130 of the memory cell 105 and the digit line 115. In some architectures, the memory cell 105 may be coupled with the digit line 115.

The sense component 145 may be operable to detect a state (e.g., a charge) stored on the capacitor 130 of the memory cell 105 and determine a logic state of the memory cell 105 based on the stored state. The sense component 145 may include one or more sense amplifiers to amplify or otherwise convert a signal resulting from accessing the memory cell 105. The sense component 145 may compare a signal detected from the memory cell 105 to a reference 150 (e.g., a reference voltage). The detected logic state of the memory cell 105 may be provided as an output of the sense component 145 (e.g., to an input/output 155), and may indicate the detected logic state to another component of a memory device that includes the memory device 100.

The local memory controller 160 may control the accessing of memory cells 105 through the various components (e.g., row decoder 120, column decoder 125, sense component 145). In some examples, one or more of the row decoder 120, column decoder 125, and sense component 145 may be co-located with the local memory controller 160. The local memory controller 160 may be operable to receive one or more of commands or data from one or more different memory controllers (e.g., an external memory controller associated with a host device, another controller associated with the memory device 100), translate the commands or the data (or both) into information that can be used by the memory device 100, perform one or more operations on the memory device 100, and communicate data from the memory device 100 to a host device based on performing the one or more operations. The local memory controller 160 may generate row signals and column address signals to activate the target word line 110 and the target digit line 115. The local memory controller 160 may also generate and control various voltages or currents used during the operation of the memory device 100. In general, the amplitude, the shape, or the duration of an applied voltage or current discussed herein may be varied and may be different for the various operations discussed in operating the memory device 100.

The local memory controller 160 may be operable to perform one or more access operations on one or more memory cells 105 of the memory device 100. Examples of access operations may include a write operation, a read operation, a refresh operation, a precharge operation, or an activate operation, among others. In some examples, access operations may be performed by or otherwise coordinated by the local memory controller 160 in response to various access commands (e.g., from a host device). The local memory controller 160 may be operable to perform other access operations not listed here or other operations related to the operating of the memory device 100 that are not directly related to accessing the memory cells 105.

The local memory controller 160 may be operable to perform a write operation (e.g., a programming operation) on one or more memory cells 105 of the memory device 100. During a write operation, a memory cell 105 of the memory device 100 may be programmed to store a desired logic state. The local memory controller 160 may identify a target memory cell 105 on which to perform the write operation. The local memory controller 160 may identify a target word line 110 and a target digit line 115 coupled with the target memory cell 105 (e.g., the address of the target memory cell 105). The local memory controller 160 may activate the target word line 110 and the target digit line 115 (e.g., applying a voltage to the word line 110 or digit line 115) to access the target memory cell 105. The local memory controller 160 may apply a specific signal (e.g., write pulse) to the digit line 115 during the write operation to store a specific state (e.g., charge) in the capacitor 130 of the memory cell 105. The pulse used as part of the write operation may include one or more voltage levels over a duration.

The local memory controller 160 may be operable to perform a read operation (e.g., a sense operation) on one or more memory cells 105 of the memory device 100. During a read operation, the logic state stored in a memory cell 105 of the memory device 100 may be determined. The local memory controller 160 may identify a target memory cell 105 on which to perform the read operation. The local memory controller 160 may identify a target word line 110 and a target digit line 115 coupled with the target memory cell 105 (e.g., the address of the target memory cell 105). The local memory controller 160 may activate the target word line 110 and the target digit line 115 (e.g., applying a voltage to the word line 110 or digit line 115) to access the target memory cell 105. The target memory cell 105 may transfer a signal to the sense component 145 in response to biasing the access lines. The sense component 145 may amplify the signal. The local memory controller 160 may activate the sense component 145 (e.g., latch the sense component) and thereby compare the signal received from the memory cell 105 to the reference 150. Based on that comparison, the sense component 145 may determine a logic state that is stored on the memory cell 105.

In some examples, the memory device 100 may include one or more fuses that store information (e.g., trimming information, system information, repair information) for operating the memory array that includes the memory cells 105. Upon power up of the memory device 100, the information stored by the fuses may be communicated (e.g., broadcast) to latches for storage and access (e.g., by the memory device 100). The latches may also be referred to as latching circuits, latching components, or other suitable terminology, and latches that are configured to store information from fuses may also be referred to as fuse latches, fuse latching circuits, fuse latching components, or other suitable terminology. Information stored by or communicated from fuses may be referred to as fuse information.

In some other techniques and apparatuses, the latches may be disposed on the same substrate (e.g., a base substrate) that includes the memory array and other components of the memory device 100, which may be an inefficient use of the base substrate. According to the techniques described herein, latches that include vertical transistors may be disposed above the base substrate. For example, the latches may be disposed at least partially within an additional substrate (or other material) that is above the base substrate, which may allow other components to be disposed on the base substrate, allow the size of the base substrate to be reduced, or both, among other advantages.

Figure 2:
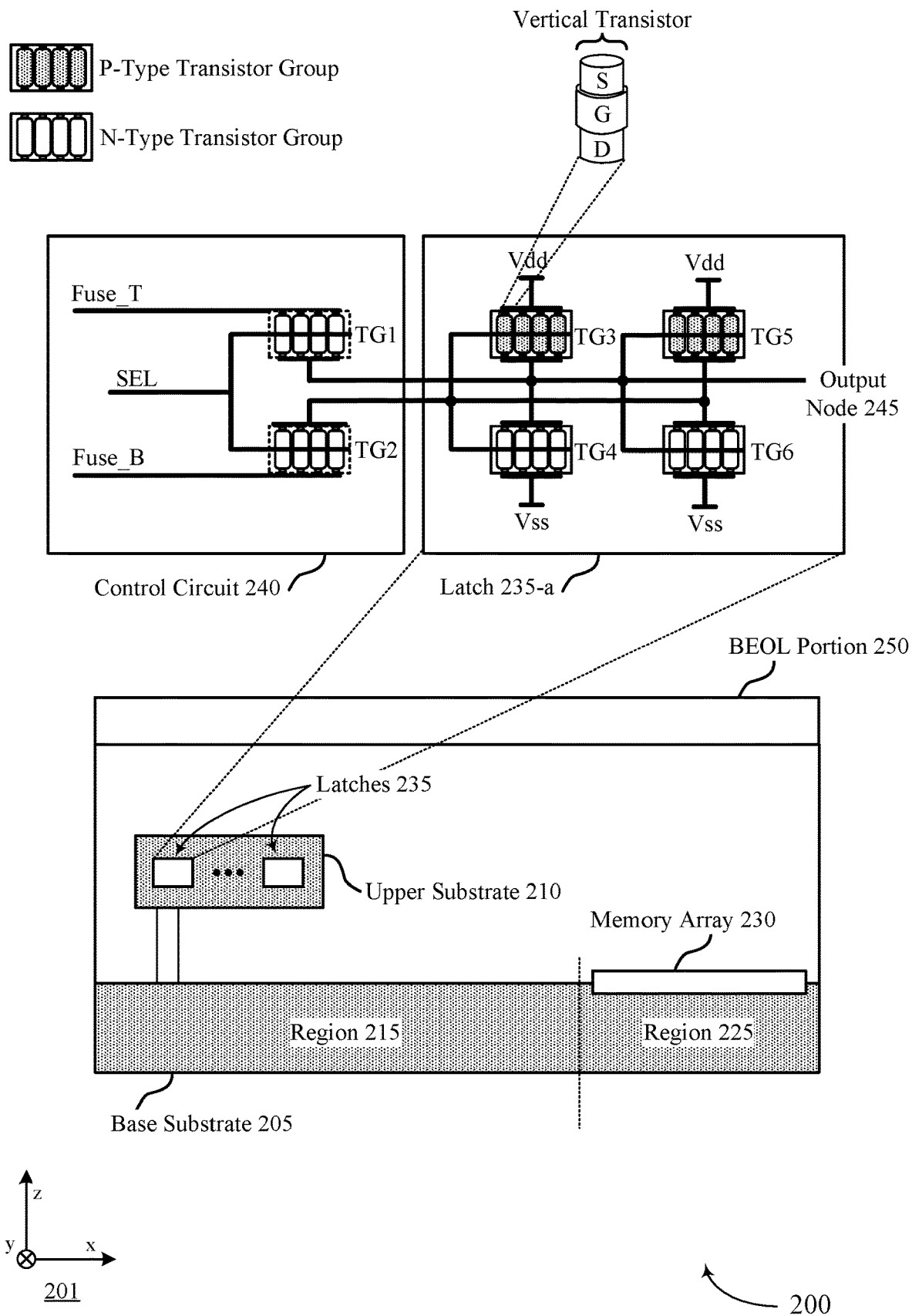
FIG. 2 illustrates an example of a memory device that supports vertical transistor fuse latches in accordance with examples as disclosed herein.

FIG. 2 illustrates an example of a memory device 200 that supports vertical transistor fuse latches in accordance with examples as disclosed herein. The memory device 200 may include a base substrate 205 (e.g., a silicon substrate) and an upper substrate 210 (e.g., a polysilicon substrate, a silicon-germanium (SiGe) substrate, an indium gallium zinc oxide (IGZO) substrate). In some examples, the upper substrate 210 may be separated from the base substrate 205 by one or more materials. In such examples, the upper substrate 210 may not directly contact the base substrate 205 while in other examples the upper substrate 210 may directly contact the base substrate 205. For illustrative purposes, aspects of the memory device 200 may be described with reference to an x-direction, a y-direction, and a z-direction of a coordinate system 201. In some examples, the z-direction may be illustrative of a direction perpendicular to a surface of the base substrate 205 (e.g., a surface in an xy-plane, a surface upon or over which other materials may be deposited). The base substrate 205 and the upper substrate 210, as illustrated by their respective cross-section in an xz-plane, may extend for some distance in the y-direction and the x-direction.

Although described relative to a base substrate and an upper substrate, the techniques described herein may be implemented using various other layers of other materials.

The base substrate 205 may include a region 215 and a region 225 that each extend in the y-direction. The region 215, which may also be referred to as the periphery site, may include or be coupled with logic and circuitry for operating a memory array 230. For example, the region 215 may be coupled with (e.g., in contact with) bank logic, pitch cells, sense amplifiers, sub-word line drivers (SWDs), or a combination thereof, among other components. The region 225 may include or be coupled with the memory array 230, which may be disposed on or at least partially within the substrate of the region 225. For example, the capacitive components (e.g., capacitors) of the memory cells of the memory array 230 may be above the region 225 and various access lines for the memory cells (e.g., word lines, digit lines) may be at least partially disposed on or within the substrate of the region 225. However, other configurations of the memory device 200 are contemplated and within the scope of the present disclosure. In some examples, input-output (I/O) circuitry for communicating with another device (e.g., a host device) may be above the upper substrate 210 (e.g., within or coupled with the back end of line (BEOL) portion 250). The BEOL portion 250 may include various materials (e.g., metal materials, dielectric materials) and may provide interconnections (e.g., contacts, insulating layers, metal levels, bonding sites) for individual components of the memory device 200 (e.g., for chip-to-package connections).

The memory device 200 may also include a set of latches 235, which may be latches that include at least one vertical transistor. The latches 235 may also be referred to as vertical transistor latches or thin-film-transistor (TFT) latches, among other suitable terminology. The latches 235 may be configured to store information from fuses that are coupled with the latches 235 (or information that may otherwise have been stored in fuses). For various reasons (e.g., due to process differences), the use of vertical transistors for the latches 235—as opposed to non-vertical transistors—may allow the latches 235 to be disposed at least partially on or within the upper substrate 210, which may free up space on the base substrate 205 that may otherwise be used for the latches 235 in other different examples.

Reference is now made to the latch 235-*a*, which may be an example of a latch 235. The latch 235-*a* may be configured to store (e.g., preserve, save) information (e.g., an output state) from a fuse.

The latch 235-*a* may include a quantity of vertical transistors groups, as shown in the expanded view. For example, the latch 235-*a* may include vertical transistor groups TG1 through TG6. Each transistor group may include one or more vertical transistors that may be connected, in some examples, in parallel and that operate in a collective (e.g., unified) manner (e.g., essentially as a single vertical transistor). For example, as shown in FIG. 2, each transistor group may include four vertical transistors connected in parallel. However, other quantities of vertical transistors per transistor group are contemplated and within the scope of the present disclosure. The use of multiple vertical transistors in parallel may allow thinner channels to be used (without reducing current flow capacity), which in turn may improve (relative to thicker channels) the current flow properties of the material used to form the vertical transistors. The use of multiple vertical transistors per transistor group may increase the reliability of the latch 235-*a* (e.g., by reducing the incidence of soft errors), among other advantages.

A vertical transistor may include a channel portion formed by one or more pillars or other structures (e.g., formed at least in part by a polycrystalline semiconductor such as polysilicon, SiGe, IGZO), and a gate portion (e.g., a conductor, such as titanium (Ti), titanium nitride (TiN), ruthenium (Ru), tungsten (W), or molybdenum (Mo), that is formed adjacent to, alongside, or at least partially surrounding the channel portion). The gate portion may be configured to activate the channel portion (e.g., open or close a conductive path of the channel portion) based on a voltage of the gate portion. For example, the gate portion (denoted G) may be configured to activate a channel between a drain portion (denoted D) and a source portion (denoted S) of the vertical transistor so that current can flow through the channel. The gate portion, drain portion, and source portion of a vertical transistor may also be referred to as a gate terminal, drain terminal, and source terminal, respectively. A vertical transistor may also be referred to as a pillar transistor, TFT, or other suitable terminology. Although shown with the source portion on the top and the drain portion on the bottom, the portions of the vertical transistor may be reversed based on the routing and voltage(s) applied to the vertical transistor.

In some examples, the latch 235-*a* may include n-type vertical transistors and p-type vertical transistors. An n-type vertical transistor may be a transistor that includes an n-doped, p-doped, n-doped stack of materials (e.g., an n-doped drain portion, a p-doped gate portion, and an n-doped source portion). Alternatively (e.g., in the case of a polysilicon channel), the source portion and drain portion may be n-doped portions of the polysilicon and the gate portion (e.g., the metal sidewall region) may be un-doped. Accordingly, an n-type vertical transistor may use electron flow to carry charge, and thus may exhibit similar characteristics as (and operate similar to) other (e.g., non-vertical) examples of n-type transistors. A p-type vertical transistor may be a transistor that includes a p-doped, n-doped, p-doped stack of materials (e.g., a p-doped drain portion, an n-doped gate portion, and a p-doped source portion). Alternatively (e.g., in the case of a polysilicon channel), the source portion and drain portion may be p-doped portions of the polysilicon and the gate portion (e.g., the metal sidewall region) may be un-doped. Accordingly, a p-type vertical transistor may use hole flow to carry charge, and thus may exhibit similar characteristics as (and operate similar to) to other (e.g., non-vertical) examples of p-type transistors. Use of p-type vertical transistors in the latches 235 may reduce the power consumption of the latches 235 (e.g., because it takes a lower gate voltage to activate a p-type vertical transistor than an n-type vertical transistor).

The latch 235-*a* may be coupled with a control circuit 240, which may include a set of switching components such as vertical transistors (e.g., within the upper substrate 210) or non-vertical transistors (e.g., disposed on and/or or at least partially within the base substrate 205). The control circuit 240 may be controlled by a select (SEL) signal (e.g., which may be related to or from a controller, such as local memory controller 160) and may be configured to selectively couple the latch 235-*a* with a corresponding fuse (e.g., from a fuse array for the memory array 230) based on the select signal. For example, the select signal may be applied to the gate terminals of the transistor groups TG1 and TG2, which may conduct current based on the applied signals Fuse_T and Fuse_B, which may be output from one or more fuses or control circuits. In some examples, the input lines for Fuse_T and Fuse-B may be shared by multiple latches 235. In some examples, the fuse array may be above the region 215 of the base substrate 205.

The latch 235-*a* may be configured to store the state of an input signal (e.g., Fuse_T or Fuse_B) at output node 245. Specifically, the latch 235-*a* may include transistor group TG3 and transistor group TG4, which may include respective gate terminals that are coupled together (e.g., via a conductive line) and that are configured to receive an input signal (e.g., Fuse_B) from the control circuit 240. The gate terminals of the transistor groups TG3 and TG4 may also be coupled with terminals (e.g., drain terminals) of the transistor group TG5 and coupled with terminals (e.g., source terminals) of the transistor group TG6. The transistor group TG3 may include: a first set of terminals (e.g., source terminals) that is coupled with a voltage source Vdd, and a second set of terminal (e.g., drain terminals) that is coupled with the transistor group TG4. The transistor group TG4 may include: a first set of terminals (e.g., drain terminals) that is coupled with a voltage source Vss, and a second set of terminals (e.g., source terminals) that is coupled with the transistor group TG3. The voltage source Vdd may have a higher voltage than the voltage source Vss. In some examples, the voltage source Vdd has a positive voltage and the voltage source Vss has a negative voltage.

The latch 235-*a* may also include transistor group TG5 and transistor group TG6, which may include respective gate terminals that are coupled together (e.g., via a conductive line) and that are configured to receive an input signal (e.g., Fuse_T) from the control circuit 240. The gate terminals of the transistor groups TG5 and TG6 may also be coupled with terminals (e.g., drain terminals) of the transistor group TG3 and coupled with terminals (e.g., source terminals) of the transistor group TG4. The transistor group TG5 may include: a first set of terminals (e.g., source terminals) that is coupled with a voltage source Vdd, and a second set of terminals (e.g., drain terminals) that is coupled with the transistor group TG6. The transistor group TG6 may include: a first set of terminals (e.g., drain terminals) that is coupled with a voltage source Vss, and a second set of terminals (e.g., source terminals) that is coupled with the transistor group TG5.

Thus, the gate terminals of the transistor groups TG3 and TG4 may be coupled together, the drain terminals of the transistor groups T3G and TG5 may be coupled with respective source terminals of the transistor groups TG4 and TG6, and the gate terminals of the transistor groups TG5 and TG6 may be coupled together, among the other connections illustrated in FIG. 2.

By using vertical transistors for the latches 235, the latches 235 may be disposed at least partially within the upper substrate 210. Thus, space on the base substrate 205 that would otherwise be used for the latches 235 may be preserved for other components, the size of the base substrate may be reduced, or both, among other advantages.

Figure 3:
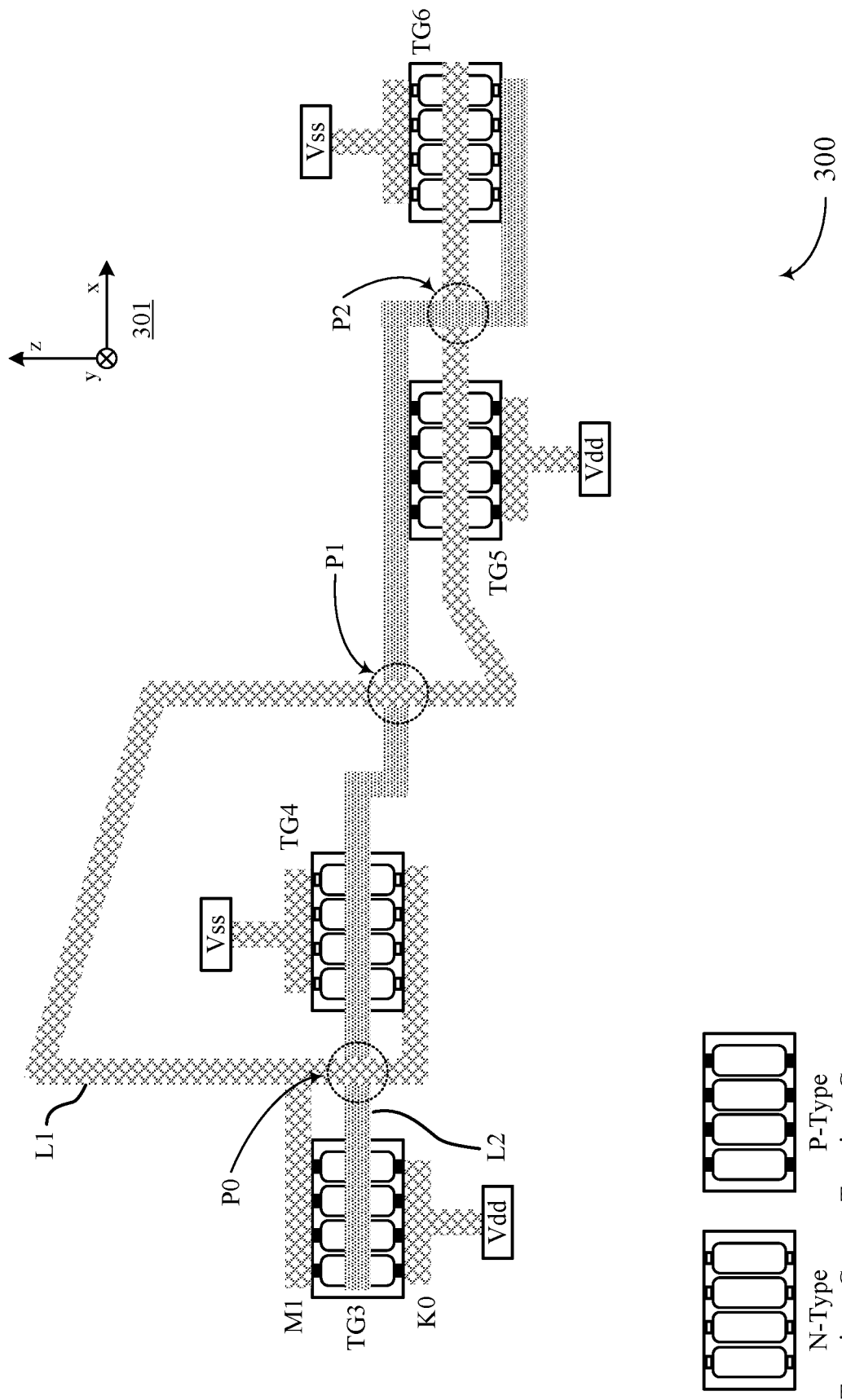
FIG. 3 illustrates an example of a latch in accordance with examples as disclosed herein.

FIG. 3 illustrates an example of a latch 300 that supports vertical transistor fuse latches in accordance with examples as disclosed herein. The latch 300 may be an example of a latch 235 as described with reference to FIG. 2, and thus may include vertical transistors that are positioned within an upper substrate (or other material) that is above a base substrate. For illustrative purposes, aspects of the latch 300 may be described with reference to an x-direction, a y-direction, and a z-direction of a coordinate system 301. In some examples, the z-direction may be illustrative of a direction perpendicular to a surface of the base substrate (e.g., a surface in an xy-plane, a surface upon or over which other materials may be deposited). The conductive lines (illustrated by various shading patterns) that connect the transistor groups of the latch 300 may extend in a three-dimensional (3D) manner through the upper substrate. For example, FIG. 3 shows a first option for routing the conductive lines behind or in front of each other in the y-direction. In FIG. 3, conductive lines that are behind other conductive lines in the y-direction are shown as disappearing underneath the other conductive lines. Conductive lines may also be referred to as connections, conductive traces, electrical traces, or other suitable terminology.

The latch 300 may be an example of the latch 235-*a* as described with reference to FIG. 2, and thus may include transistor groups TG3 through TG6. The transistor groups TG3 through TG6 may be logically connected as shown and described with reference to FIG. 2. But conductive lines that may otherwise cross in one plane may be disposed in different planes. For example, at least a first portion (e.g., portion P0) of the conductive line L1 that couples the drain terminals of the transistor group TG3 with the source terminals of the transistor group TG4 (and the gate terminals of the transistor groups TG5 and TG6) may be disposed in front (with respect to the y-direction) of at least a first portion of the conductive line L2 that couples the gate terminals of the transistor groups TG3 and TG4 with the drain terminals of the transistor group TG5 and the source terminals of the transistor group TG6. In some examples, the conductive line L1 may be coupled with a first switching component (e.g., the transistor group TG1) of a control circuit and the conductive line L2 may be coupled with a second switching component (e.g., the transistor group TG2) of the control circuit.

Additionally or alternatively, at least a second portion (e.g., portion P1) of the conductive line L1 may be disposed in front of (with respect to the y-direction) at least a second portion of the conductive line L2. Additionally or alternatively, at least a third portion (e.g., portion P2) of the conductive line L1 may be disposed behind (with respect to the y-direction) at least a third portion of the conductive line L2. The portion P0 may be positioned between the transistor group TG3 and the transistor group TG4 in the x-direction; the portion P1 may be positioned between the transistor group TG4 and the transistor group TG5 in the x-direction; and the portion P2 may be positioned between the transistor group TG5 and the transistor group TG6 in the x-direction.

In some examples, one or more conductive lines may be used to couple the terminals of the vertical transistors in a transistor group. For example, conductive line M1 may couple the drain terminals of the vertical transistors in transistor group TG3, and K0 may couple the source terminals of the vertical transistors in transistor group TG3. Similar intra-transistor group terminal-connecting conductive lines may be used for the other transistors groups TG4 through TG6. Use of the conductive lines M1 and K0 may allow the vertical transistors in a transistor group to function or operate as a single vertical transistor. For example, the conductive line M1 may couple the drain terminals of the vertical transistors in the transistor group TG3 so that the drain terminals collectively form a drain terminal for the transistor group TG3. Similarly, the conductive line K0 may couple the source terminals of the vertical transistors in the transistor group TG3 so that the source terminals collectively form a source terminal for the transistor group TG3.

Thus, the conductive lines may extend in a 3D manner (e.g., within an upper substrate or other material) to connect the vertical transistors in the latch 300. However, other configurations and orientations of the conductive lines are contemplated and within the scope of the present disclosure.

Figure 4:
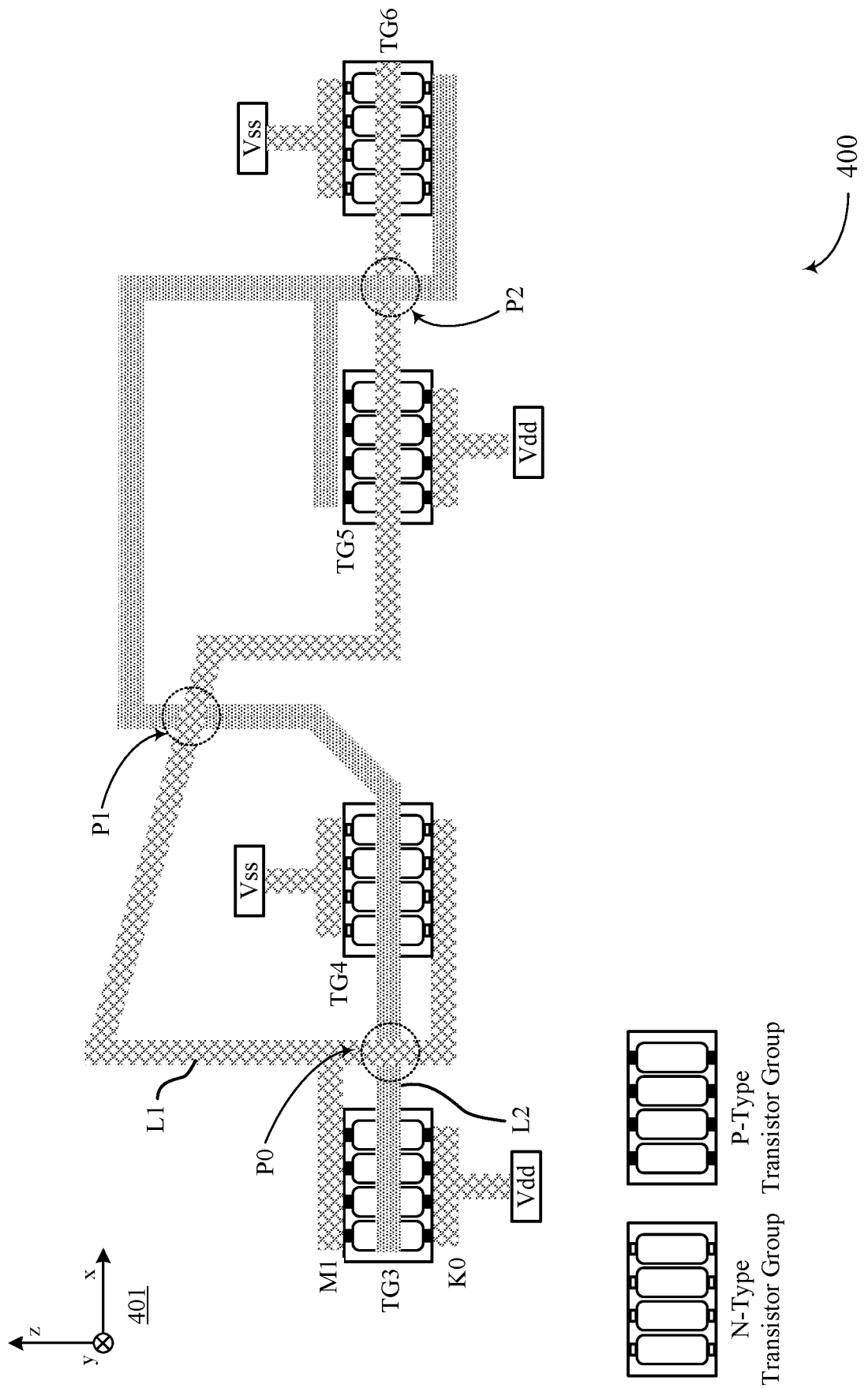
FIG. 4 illustrates an example of a latch in accordance with examples as disclosed herein.

FIG. 4 illustrates an example of a latch 400 that supports vertical transistor fuse latches in accordance with examples as disclosed herein. The latch 400 may be an example of a latch 235 as described with reference to FIG. 2, and thus may include vertical transistors that are positioned within an upper substrate (or other material) that is above a base substrate. For illustrative purposes, aspects of the latch 400 may be described with reference to an x-direction, a y-direction, and a z-direction of a coordinate system 401. In some examples, the z-direction may be illustrative of a direction perpendicular to a surface of the base substrate (e.g., a surface in an xy-plane, a surface upon or over which other materials may be deposited). The conductive lines (illustrated by various shading patterns) that connect the vertical transistors of the latch 400 may extend in a 3D manner through the upper substrate. For example, FIG. 4 shows a second option for routing the conductive lines behind or in front of each other in the y-direction. In FIG. 4, conductive lines that are behind other conductive lines in the y-direction are shown as disappearing underneath the other conductive lines.

The latch 400 may be an example of the latch 235-a as described with reference to FIG. 2, and thus may include transistor groups TG3 through TG6. The transistor groups TG3 through TG6 may be logically connected as shown and described with reference to FIG. 2. But conductive lines that may otherwise cross in one plane may be disposed in different planes. For example, at least a first portion (e.g., portion P0) of the conductive line L1 that couples the drain terminals of the transistor group TG3 with the source terminals of the transistor group TG4 (and the gate terminals of the transistor groups TG5 and TG6) may be disposed in front (with respect to the y-direction) of at least a first portion of the conductive line L2 that couples the gate terminals of the transistor groups TG3 and TG4 with the drain terminals of the transistor group TG5 and the source terminals of the transistor group TG6. In some examples, the conductive line L1 may be coupled with a first switching component (e.g., the transistor group TG1) of a control circuit and the conductive line L2 may be coupled with a second switching component (e.g., the transistor group TG2) of the control circuit Additionally or alternatively, at least a second portion (e.g., portion P1) of the conductive line L1 may be disposed in front of (with respect to the y-direction) at least a second portion of the conductive line L2. Additionally or alternatively, at least a third portion (e.g., portion P2) of the conductive line L1 may be disposed behind (with respect to the y-direction) at least a third portion of the conductive line L2. The portion P0 may be positioned between the transistor group TG3 and the transistor group TG4 in the x-direction; the portion P1 may be positioned between the transistor group TG4 and the transistor group TG5 in the x-direction; and the portion P2 may be positioned between the transistor group TG5 and the transistor TG6 in the x-direction.

In some examples, one or more conductive lines may be used to couple the terminals of the vertical transistors in a transistor group. For example, conductive line M1 may couple the drain terminals of the vertical transistors in transistor group TG3, and K0 may couple the source terminals of the vertical transistors in transistor group TG3. Similar intra-transistor group terminal-connecting conductive lines may be used for the other transistors groups TG4 through TG6.

Thus, the conductive lines may extend in a 3D manner (e.g., within an upper substrate or other material) to connect the vertical transistors in the latch 400. However, other configurations and orientations of the conductive lines are contemplated and within the scope of the present disclosure.

Figure 5:
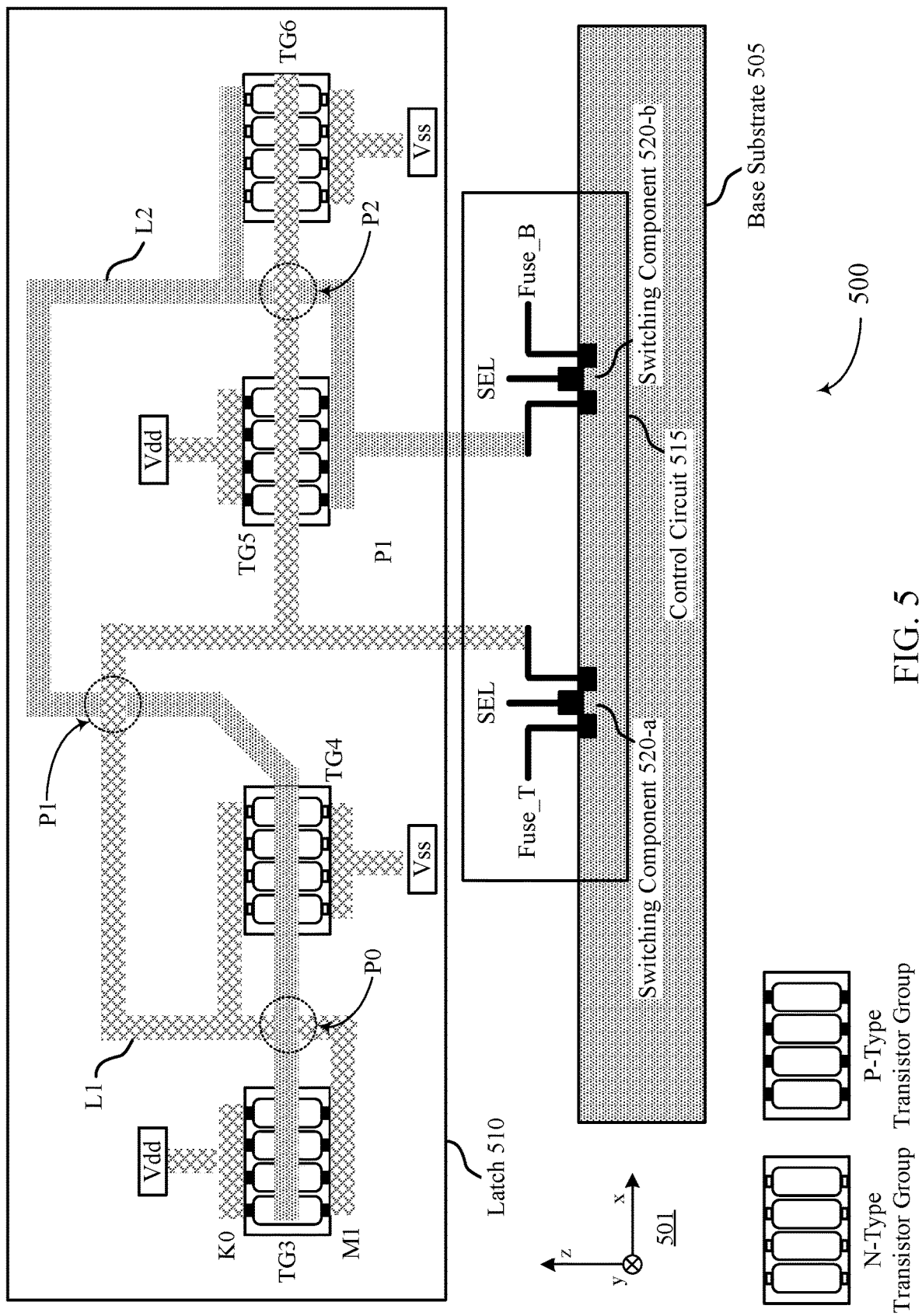
FIG. 5 illustrates an example of a device that supports vertical transistor fuse latches in accordance with examples as disclosed herein.

FIG. 5 illustrates an example of a device 500 that supports vertical transistor fuse latches in accordance with examples as disclosed herein. The device 500 may be an example of a portion of the memory device 200 as described with reference to FIG. 2. The device 500 may include a base substrate 505 and a latch 510 that is disposed at least partially within an upper substrate (or other material). For illustrative purposes, aspects of the latch 400 may be described with reference to an x-direction, a y-direction, and a z-direction of a coordinate system 501. In some examples, the z-direction may be illustrative of a direction perpendicular to a surface of the base substrate 505 (e.g., a surface in an xy-plane, a surface upon or over which other materials may be deposited). The conductive lines (illustrated by various shading patterns) that connect the vertical transistors of the latch 510 may extend in a 3D manner through the upper substrate. For example, FIG. 5 shows a third option for routing the conductive lines behind or in front of each other in the y-direction. In FIG. 5, conductive lines that are behind other conductive lines in the y-direction are shown as disappearing underneath the other conductive lines.

FIG. 5 may also illustrate the connections between the latch 510 and a control circuit 515 that is coupled with (e.g., at least partially disposed within) the base substrate 505.

The latch 510 may be an example of the latch 235-*a* as described with reference to FIG. 2 and thus may include transistor groups TG3 through TG6. The transistor groups TG3 through TG6 may be logically connected as shown and described with reference to FIG. 2. But conductive lines that may otherwise cross in one plane may be disposed in different planes. For example, at least a first portion (e.g., portion P0) of the conductive line L1 that couples the drain terminals of the transistor group TG3 with the source terminals of the transistor group TG4 (and the gate terminals of the transistor groups TG5 and TG6) may be disposed behind (with respect to the y-direction) of at least a first portion of the conductive line L2 that couples the gate terminals of the transistor groups TG3 and TG4 with the drain terminals of the transistor group TG5 and the source terminals of the transistor group TG6. The conductive line L1 may be coupled with the transistor group TG1, and the conductive line L2 may be coupled with the transistor group TG2.

Additionally or alternatively, at least a second portion (e.g., portion P1) of the conductive line L1 may be disposed in front of (with respect to the y-direction) at least a second portion of the conductive line L2. Additionally or alternatively, at least a third portion (e.g., portion P2) of the conductive line L1 may be disposed in front of (with respect to the y-direction) at least a third portion of the conductive line L2. The portion P0 may be positioned between the transistor group TG3 and the transistor group TG4 in the x-direction; the portion P1 may be positioned between the transistor group TG4 and the transistor group TG5 in the x-direction; and the portion P2 may be positioned between the transistor group TG5 and the transistor TG6 in the x-direction.

The conductive lines L1 and L2 may also couple the latch 510 with the control circuit 515, which be an example of, or function similar to, the control circuit 240 as described with reference to FIG. 2. For example, the conductive line L1 may couple the gate terminals of the transistor groups TG5 and TG6 with switching component 520-*a*, which may be a non-vertical transistor (e.g., disposed at least partially on the base substrate 505) or a vertical transistor (e.g., disposed above the base substrate 505, possibly at least partially within the same upper substrate as the latch 510). And the conductive line L2 may couple the gate terminals of the transistor groups TG3 and TG4 with switching component 520-*b*, which may be a non-vertical transistor (e.g., disposed at least partially on the base substrate 505) or a vertical transistor (e.g., disposed above the substrate, possibly at least partially within the same upper substrate as the latch 510). Thus, the switching components 520 may be 1) non-vertical transistors that are disposed at least partially within the base substrate 505, as shown, or 2) vertical transistors (as shown in FIG. 2) that are disposed above the base substrate 505. As noted, the switching components 520 may be controlled (e.g., via the select signal) so that the signals Fuse_T and Fuse_B (which may be from a fuse corresponding to the latch 510) are selectively applied to the latch 510.

In some examples, one or more conductive lines may be used to couple the terminals of the vertical transistors in a transistor group. For example, conductive line M1 may couple the drain terminals of the vertical transistors in transistor group TG3, and K0 may couple the source terminals of the vertical transistors in transistor group TG3. Similar intra-transistor group terminal-connecting conductive lines may be used for the other transistors groups TG4 through TG6.

Thus, the conductive lines may extend in a 3D manner (e.g., within an upper substrate or other material) to connect the vertical transistors in the latch 510 as well as the control circuit 515. However, other configurations and orientations of the conductive lines are contemplated and within the scope of the present disclosure.

An apparatus is described. The apparatus may include a substrate; a memory array coupled with the substrate; and a latch configured to store information from a fuse for the memory array, the latch including a plurality of p-type vertical transistors and a plurality of n-type vertical transistors each at least partially disposed within an additional substrate above the substrate.

In some examples of the apparatus, the plurality of p-type vertical transistors includes a first p-type vertical transistor coupled with a second p-type vertical transistor. In some examples of the apparatus, the plurality of n-type vertical transistors includes a first n-type vertical transistor coupled with a second n-type vertical transistor.

In some examples, the apparatus may include a first conductive line that couples a gate terminal of the first p-type vertical transistor with a gate terminal of the first n-type vertical transistor. In some examples, the apparatus may include a second conductive line that couples a gate terminal of the second p-type vertical transistor with a gate terminal of the second n-type vertical transistor.

In some examples, the apparatus may include a first conductive line that couples a source terminal of the first n-type vertical transistor with a drain terminal of the first p-type vertical transistor. In some examples, the apparatus may include a second conductive line that couples a source terminal of the second n-type vertical transistor with a drain terminal of the second p-type vertical transistor.

In some examples, the apparatus may include a first conductive line that couples a source terminal of the first n-type vertical transistor and a drain terminal of the first p-type vertical transistor with a gate terminal of the second n-type vertical transistor and a gate terminal of the second p-type vertical transistor and a second conductive line that couples a source terminal of the second n-type vertical transistor and a drain terminal of the second p-type vertical transistor with a gate terminal of the first n-type vertical transistor and a gate terminal of the first p-type vertical transistor.

In some examples, the apparatus may include a first plurality of conductive lines, where each conductive line in the first plurality couples source terminals of a respective set of the plurality of p-type vertical transistors that may be connected in parallel. In some examples, the apparatus may include a second plurality of conductive lines, where each conductive line in the second plurality couples drain terminals of a respective set of the plurality of n-type vertical transistors that may be connective in parallel.

In some examples, the apparatus may include a set of transistors disposed on the substrate and configured to selectively couple the latch with the fuse. In some examples of the apparatus, the memory array includes memory cells that are positioned above a first region of the substrate. In some examples of the apparatus, the latch may be positioned above a second region of the substrate.

In some examples, the apparatus may include logic that is disposed on the second region of the substrate and that is configured for operating the memory array. In some examples of the apparatus, the memory array includes a DRAM array.

Another apparatus is described. The apparatus may include a memory array coupled with a substrate; a fuse for the memory array; and a latch at least partially within an additional substrate above the substrate and configured to store information from the fuse, the latch including: a first p-type vertical transistor including a gate terminal and a drain terminal; a first n-type vertical transistor including a gate terminal coupled with the gate terminal of the first p-type vertical transistor and including a source terminal coupled with the drain terminal of the first p-type vertical transistor; a second p-type vertical transistor including a gate terminal and a drain terminal; and a second n-type vertical transistor including a gate terminal coupled with the gate terminal of the second p-type vertical transistor and including a source terminal coupled with the drain terminal of the second p-type vertical transistor.

In some examples, the apparatus may include a network of conductive lines that couples the first p-type vertical transistor, the first n-type vertical transistor, the second p-type vertical transistor, and the second n-type vertical transistor, where the network of conductive lines extends through the additional substrate in a three-dimensional manner.

In some examples, the apparatus may include a set of transistors coupled with the substrate and configured to selectively couple the fuse with the respective gate terminals of the first p-type vertical transistor and the first n-type vertical transistor.

In some examples, the apparatus may include a first conductive line that couples the source terminal of the first n-type vertical transistor and the drain terminal of the first p-type vertical transistor with the gate terminal of the second n-type vertical transistor and the gate terminal of the second p-type vertical transistor. In some examples, the apparatus may include a second conductive line that couples the source terminal of the second n-type vertical transistor and the drain terminal of the second p-type vertical transistor with the gate terminal of the first n-type vertical transistor and the gate terminal of the first p-type vertical transistor.

In some examples, the apparatus may include a first negative voltage supply coupled with a drain terminal of the first n-type vertical transistor and second negative voltage supply coupled with a drain terminal of the second n-type vertical transistor. In some examples, the apparatus may include a first positive voltage supply coupled with a source terminal of the first p-type vertical transistor and second positive voltage supply coupled with a source terminal of the second p-type vertical transistor.

In some examples of the apparatus, the memory array may be disposed at least partially within a first region of the substrate. In some examples, the latch may be above a second region of the substrate.

Another apparatus is described. The apparatus may include a first substrate; a memory array coupled with and disposed at least partially above the first substrate; a first p-type vertical transistor of a latch that is configured to store information from a fuse for the memory array, the first p-type vertical transistor at least partially within a second substrate that is above the first substrate; and a first n-type vertical transistor of the latch, the first n-type vertical transistor at least partially within the second substrate that is above the first substrate.

In some examples, the apparatus may include a first conductive line that couples a gate terminal of the first p-type vertical transistor with a gate terminal of the first n-type vertical transistor. In some examples, the apparatus may include a second conductive line that couples a drain terminal of the first p-type vertical transistor with a source terminal of the first n-type vertical transistor.

In some examples, the apparatus may include a second p-type vertical transistor of the latch, the second p-type vertical transistor at least partially within the second substrate that may be above the first substrate. In some examples, the apparatus may include a second n-type vertical transistor of the latch, the second n-type vertical transistor at least partially within the second substrate that may be above the first substrate.

In some examples, the apparatus may include a third conductive line that couples a gate terminal of the second p-type vertical transistor with a gate terminal of the second n-type vertical transistor. In some examples, the apparatus may include a fourth conductive line that couples a drain terminal of the second p-type vertical transistor with a source terminal of the second n-type vertical transistor.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, and/or materials. In some examples, one layer or level may be composed of two or more sublayers or sublevels.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
    a substrate;
    a memory array coupled with the substrate; and
    a latch configured to store information from a fuse for the memory array, the latch disposed within an additional substrate above the substrate and comprising:
        a plurality of p-type vertical transistors comprising a first plurality of gate terminals coupled together; and
        a plurality of n-type vertical transistors comprising a second plurality of gate terminals coupled together.

2. The apparatus of claim 1, wherein the plurality of p-type vertical transistors comprises:
    a first p-type vertical transistor and a second p-type vertical transistor each coupled with a positive voltage supply, and wherein the plurality of n-type vertical transistors comprises:
    a first n-type vertical transistor and a second n-type vertical transistor each coupled with a negative voltage supply.

3. The apparatus of claim 2, further comprising:
    a first conductive line that couples a gate terminal of the first p-type vertical transistor with a gate terminal of the first n-type vertical transistor; and
    a second conductive line that couples a gate terminal of the second p-type vertical transistor with a gate terminal of the second n-type vertical transistor.

4. The apparatus of claim 2, further comprising:
    a first conductive line that couples a source terminal of the first n-type vertical transistor with a drain terminal of the first p-type vertical transistor; and
    a second conductive line that couples a source terminal of the second n-type vertical transistor with a drain terminal of the second p-type vertical transistor.

5. The apparatus of claim 2, further comprising:
    a first conductive line that couples a source terminal of the first n-type vertical transistor and a drain terminal of the first p-type vertical transistor with a gate terminal of the second n-type vertical transistor and a gate terminal of the second p-type vertical transistor; and
    a second conductive line that couples a source terminal of the second n-type vertical transistor and a drain terminal of the second p-type vertical transistor with a gate terminal of the first n-type vertical transistor and a gate terminal of the first p-type vertical transistor.

6. The apparatus of claim 1, further comprising:
    a set of transistors disposed on the substrate and configured to selectively couple the latch with the fuse.

7. The apparatus of claim 1, wherein the memory array comprises memory cells that are positioned above a first region of the substrate, and wherein the latch is positioned above a second region of the substrate.

8. The apparatus of claim 7, further comprising:
    logic disposed on the second region of the substrate and configured for operating the memory array.

9. The apparatus of claim 1, wherein the memory array comprises a dynamic random access memory (DRAM) array.

10. An apparatus, comprising:
    a substrate;
    a memory array coupled with the substrate;
    a latch configured to store information from a fuse for the memory array, the latch comprising a plurality of p-type vertical transistors and a plurality of n-type vertical transistors each at least partially disposed within an additional substrate above the substrate;
    a first plurality of conductive lines, wherein each conductive line in the first plurality of conductive lines couples source terminals of a respective set of the plurality of p-type vertical transistors that are connected in parallel; and
    a second plurality of conductive lines, wherein each conductive line in the second plurality of conductive lines couples drain terminals of a respective set of the plurality of n-type vertical transistors that are connective in parallel.

11. An apparatus, comprising:
    a memory array coupled with a substrate;
    a fuse for the memory array; and
    a latch at least partially within an additional substrate above the substrate and configured to store information from the fuse, the latch comprising:
        a first p-type vertical transistor comprising a gate terminal and a drain terminal;
        a first n-type vertical transistor comprising a gate terminal coupled with the gate terminal of the first p-type vertical transistor and comprising a source terminal coupled with the drain terminal of the first p-type vertical transistor;
        a second p-type vertical transistor comprising a gate terminal and a drain terminal; and
        a second n-type vertical transistor comprising:
            a gate terminal coupled with the gate terminal of the second p-type vertical transistor, coupled with the drain terminal of the first p-type vertical transistor, and coupled with the source terminal of the first n-type vertical transistor; and
            a source terminal coupled with the drain terminal of the second p-type vertical transistor.

12. The apparatus of claim 11, further comprising:
    a first conductive line that couples the source terminal of the first n-type vertical transistor and the drain terminal of the first p-type vertical transistor with the gate terminal of the second n-type vertical transistor and the gate terminal of the second p-type vertical transistor; and
    a second conductive line that couples the source terminal of the second n-type vertical transistor and the drain terminal of the second p-type vertical transistor with the gate terminal of the first n-type vertical transistor and the gate terminal of the first p-type vertical transistor.

13. The apparatus of claim 11, wherein the memory array is disposed at least partially within a first region of the substrate, and wherein the latch is above a second region of the substrate.

14. An apparatus, comprising:
a memory array coupled with a substrate;
a fuse for the memory array;
a latch at least partially within an additional substrate above the substrate and configured to store information from the fuse, the latch comprising:
  a first p-type vertical transistor comprising a gate terminal and a drain terminal;
  a first n-type vertical transistor comprising a gate terminal coupled with the gate terminal of the first p-type vertical transistor and comprising a source terminal coupled with the drain terminal of the first p-type vertical transistor;
  a second p-type vertical transistor comprising a gate terminal and a drain terminal;
  a second n-type vertical transistor comprising a gate terminal coupled with the gate terminal of the second p-type vertical transistor and comprising a source terminal coupled with the drain terminal of the second p-type vertical transistor; and
  a network of conductive lines that couples the first p-type vertical transistor, the first n-type vertical transistor, the second p-type vertical transistor, and the second n-type vertical transistor, wherein the network of conductive lines extends through the additional substrate in a three-dimensional manner; and
a set of transistors coupled with the substrate and configured to selectively couple the fuse with respective gate terminals of the first p-type vertical transistor and the first n-type vertical transistor.

15. An apparatus, comprising:
a memory array coupled with a substrate;
a fuse for the memory array;
a latch at least partially within an additional substrate above the substrate and configured to store information from the fuse, the latch comprising:
  a first p-type vertical transistor comprising a gate terminal and a drain terminal;
  a first n-type vertical transistor comprising a gate terminal coupled with the gate terminal of the first p-type vertical transistor and comprising a source terminal coupled with the drain terminal of the first p-type vertical transistor;
  a second p-type vertical transistor comprising a gate terminal and a drain terminal; and
  a second n-type vertical transistor comprising a gate terminal coupled with the gate terminal of the second p-type vertical transistor and comprising a source terminal coupled with the drain terminal of the second p-type vertical transistor;
a first negative voltage supply coupled with a drain terminal of the first n-type vertical transistor and second negative voltage supply coupled with a drain terminal of the second n-type vertical transistor; and
a first positive voltage supply coupled with a source terminal of the first p-type vertical transistor and second positive voltage supply coupled with a source terminal of the second p-type vertical transistor.

16. An apparatus, comprising:
a first substrate;
a memory array coupled with and disposed at least partially above the first substrate;
a first p-type vertical transistor of a latch that is configured to store information from a fuse for the memory array, the first p-type vertical transistor at least partially within a second substrate that is above the first substrate;
a first n-type vertical transistor of the latch, the first n-type vertical transistor at least partially within the second substrate that is above the first substrate; and
a second n-type vertical transistor comprising a gate terminal coupled with a drain terminal of the first p-type vertical transistor and coupled with a source terminal of the first n-type vertical transistor.

17. The apparatus of claim 16, further comprising:
a first conductive line that couples a gate terminal of the first p-type vertical transistor with a gate terminal of the first n-type vertical transistor; and
a second conductive line that couples a drain terminal of the first p-type vertical transistor with a source terminal of the first n-type vertical transistor.

18. The apparatus of claim 17, further comprising:
a second p-type vertical transistor of the latch, the second p-type vertical transistor at least partially within the second substrate that is above the first substrate; and
a second n-type vertical transistor of the latch, the second n-type vertical transistor at least partially within the second substrate that is above the first substrate.

19. The apparatus of claim 18, further comprising:
a third conductive line that couples a gate terminal of the second p-type vertical transistor with a gate terminal of the second n-type vertical transistor; and
a fourth conductive line that couples a drain terminal of the second p-type vertical transistor with a source terminal of the second n-type vertical transistor.

* * * * *